United States Patent
Lee et al.

(10) Patent No.: US 12,300,514 B2
(45) Date of Patent: May 13, 2025

(54) CHEMICAL LIQUID SUPPLY UNIT AND SUBSTRATE PROCESSING APPARATUS INCLUDING THE SAME

(71) Applicant: SEMES CO., LTD., Cheonan-si (KR)

(72) Inventors: Seong Soo Lee, Suwon-si (KR); Dong Hee Son, Hwaseong-si (KR); Moon Sik Choi, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 160 days.

(21) Appl. No.: 18/124,277

(22) Filed: Mar. 21, 2023

(65) Prior Publication Data

US 2024/0055276 A1      Feb. 15, 2024

(30) Foreign Application Priority Data

Aug. 9, 2022  (KR) .......... 10-2022-0099137

(51) Int. Cl.
*H01L 21/67* (2006.01)
*C02F 1/68* (2023.01)

(52) U.S. Cl.
CPC .......... *H01L 21/67017* (2013.01); *C02F 1/68* (2013.01); *H01L 21/67051* (2013.01); *C02F 2209/05* (2013.01)

(58) Field of Classification Search
None
See application file for complete search history.

(56) References Cited

U.S. PATENT DOCUMENTS

| | | | | |
|---|---|---|---|---|
| 4,517,135 A * | 5/1985 | Szerenyi | ............... | B01F 35/213 422/62 |
| 5,264,025 A * | 11/1993 | Asai | .......... | C02F 1/20 261/DIG. 7 |
| 5,660,640 A * | 8/1997 | Laube | ...................... | B08B 3/08 134/28 |
| 6,158,721 A * | 12/2000 | Katou | ................... | B01F 23/232 261/DIG. 7 |
| 6,861,371 B2 * | 3/2005 | Kamikawa | ........ | H01L 21/67023 438/747 |
| 7,731,161 B2 * | 6/2010 | Seiwert | ................... | C02F 1/685 261/DIG. 7 |
| 8,133,327 B2 * | 3/2012 | Tokuno | ............ | H01L 21/02052 134/28 |
| 8,448,925 B2 * | 5/2013 | Seiwert | ............. | H01L 21/02041 261/DIG. 7 |
| 8,978,671 B2 * | 3/2015 | Tanaka | .............. | H01L 21/67028 134/94.1 |
| 10,773,221 B2 * | 9/2020 | Brammer | ............ | B01F 35/2113 |
| 11,542,185 B2 * | 1/2023 | Saito | ................... | B01F 35/2111 |
| 11,850,635 B2 * | 12/2023 | Son | ........................... | B08B 3/08 |

(Continued)

FOREIGN PATENT DOCUMENTS

| | | |
|---|---|---|
| JP | 2007-075713 | 3/2007 |
| JP | 2008-211096 | 9/2008 |

(Continued)

OTHER PUBLICATIONS

Office Action from the Korean Intellectual Property Office dated Oct. 17, 2023.

*Primary Examiner* — Umashankar Venkatesan

(57) ABSTRACT

A chemical liquid supply unit and a substrate processing apparatus including the same are proposed, which is capable of efficiently removing contaminants in a chemical liquid.

20 Claims, 6 Drawing Sheets

(56) References Cited

U.S. PATENT DOCUMENTS

| | | | | |
|---|---|---|---|---|
| 2004/0012104 A1* | 1/2004 | Ozawa | ............... | C02F 1/68 |
| | | | | 261/23.1 |
| 2005/0133066 A1* | 6/2005 | Takahashi | ............ | B08B 3/02 |
| | | | | 134/25.4 |
| 2013/0084386 A1* | 4/2013 | Yamaguchi | ......... | G11B 5/8404 |
| | | | | 134/1 |
| 2024/0058845 A1* | 2/2024 | Son | ............... | B08B 13/00 |

FOREIGN PATENT DOCUMENTS

| | | |
|---|---|---|
| KR | 10-2009-0097247 | 9/2009 |
| KR | 10-1664217 | 10/2016 |
| KR | 10-2017-0072690 | 6/2017 |
| KR | 10-2020-0103113 | 9/2020 |
| WO | 2019-0181339 | 9/2019 |

* cited by examiner

CHEMICAL LIQUID SUPPLY UNIT AND SUBSTRATE PROCESSING APPARATUS INCLUDING THE SAME

CROSS REFERENCE TO RELATED APPLICATION

The present application claims priority to Korean Patent Application No. 10-2022-0099137, filed Aug. 9, 2022, the entire contents of which is incorporated by reference herein for all purposes.

BACKGROUND OF THE INVENTION

1. Field of the Invention

The present disclosure relates to a chemical liquid supply unit and a substrate processing apparatus including the same.

2. Description of the Related Art

In general, with high density, high integration, and high performance of semiconductor devices, miniaturization of circuit patterns has rapidly progressed. Contaminants such as particles, organic contaminants, and metal contaminants that remain on a surface of a substrate greatly affect the device properties and production yield. Therefore, a cleaning process to remove various contaminants attached to the substrate surface has become very important in the semiconductor manufacturing process, and the substrate cleaning process is performed before and after each unit process of manufacturing the semiconductor.

Cleaning methods currently used in the semiconductor manufacturing process are largely divided into dry cleaning and wet cleaning. The wet cleaning is divided into a bath type method in which the substrate is immersed in a chemical liquid and contaminants are removed by chemical dissolution, and a spin type method in which the substrate is loaded on a spin chuck and a chemical liquid is supplied to the substrate surface during rotation of the substrate to remove contaminants.

Deionized water (DIW) is a type of a chemical liquid used as a cleaning liquid and prevents metal corrosion and contamination of the apparatus and is known to be used for cleaning the semiconductor apparatus. The DIW may be used while being mixed with a gas such as the carbon dioxide ($CO_2$), nitrogen ($N_2$), or the like in order to efficiently perform cleaning. Among the gases, when $CO_2$ water that is a mixture of $CO_2$ and DIW is used to perform the cleaning process, as an electrically inactive process, it has the advantage of allowing damage free cleaning while maintaining the integrity of the apparatus.

The $CO_2$ water may be generated by injecting $CO_2$ and DIW into a mixing member. The mixing member may be configured to mix $CO_2$ and DIW and be provided into various types. For example, $CO_2$ water may be generated by a mixing member including a hollow fiber membrane. In a process in which $CO_2$ and DIW are mixed while being in contact with the hollow fiber membrane in the mixing member, foreign substances such as particles, contaminants, byproduct, etc. that existing in the hollow fiber membrane may be added to the $CO_2$ water, thereby causing contamination of the $CO_2$ water.

SUMMARY OF THE INVENTION

The present disclosure is intended to provide a chemical liquid supply unit and a substrate processing apparatus including the same, wherein the chemical liquid supply unit is capable of efficiently removing foreign substances (e.g., contaminants, particles, etc.) contained in $CO_2$ water in a process of supplying the $CO_2$ water by mixing deionized water and $CO_2$.

Furthermore, the present disclosure is intended to provide a chemical liquid supply unit and a substrate processing apparatus including the same, wherein chemical liquid supply unit is capable of supplying the $CO_2$ water with improved cleanliness.

The objective of the present disclosure is not limited to the above description, and other objectives and advantages not mentioned will be clearly understood by those skilled in the art from the subsequent description.

According to an embodiment of the present disclosure, a chemical liquid supply unit for supplying $CO_2$ water generated by mixing deionized water and $CO_2$ onto a substrate may be provided. The chemical liquid supply unit may include: a mixing unit configured to mix deionized water and $CO_2$; a first supply unit configured to supply the deionized water to the mixing unit; a second supply unit configured to supply the $CO_2$ to the mixing unit; and a filter member configured to remove foreign substances in the $CO_2$ water mixed by the mixing unit, wherein the filter member may be disposed on a transfer line configured to transfer the $CO_2$ water from the mixing unit onto the substrate. For example, the transfer line may include a first section in which the $CO_2$ water may flow at a first flow rate and a second section in which the $CO_2$ water may flow at a second flow rate greater than the first flow rate, and the filter member may be disposed in the first section.

According to an embodiment of the present disclosure, there may be provided a substrate processing apparatus including: a substrate support member configured to support a substrate; a nozzle configured to spray $CO_2$ water generated by mixing $CO_2$ with deionized water to the substrate loaded on the substrate support member; and a chemical liquid supply unit configured to supply the $CO_2$ water to the nozzle. The chemical liquid supply unit may include: a mixing unit configured to mix deionized water and $CO_2$; a first supply unit configured to supply the deionized water to the mixing unit; a second supply unit configured to supply the $CO_2$ to the mixing unit; and a filter member configured to remove foreign substances in the $CO_2$ water mixed by the mixing unit, wherein the filter member may be disposed on a transfer line configured to transfer the $CO_2$ water from the mixing unit to the nozzle. For example, transfer line may include a first section in which the $CO_2$ water may flow at a first flow rate and a second section in which the $CO_2$ water may flow at a second flow rate greater than the first flow rate, and the filter member may be disposed in the first section.

According to an embodiment of the present disclosure, there may be provided substrate processing equipment including: a loading port in which a carrier accommodating a substrate is loaded; an index frame in which an index robot is provided to transfer the substrate from the carrier loaded in the loading port; and a process treatment module including a substrate processing apparatus configured to perform a liquid treatment process with respect to the substrate. The substrate processing apparatus may include: a substrate support member configured to support the substrate; a nozzle configured to spray a chemical liquid to the substrate placed in the substrate support member; and a chemical liquid supply unit configured to supply the chemical liquid to the nozzle, wherein the chemical liquid supply unit may include: a mixing unit configured to mix deionized water and $CO_2$; a first supply unit configured to supply the deionized water to the mixing unit; a second supply unit configured to supply the CO2 to the mixing unit; and a filter member configured to remove foreign substances in the CO2 water mixed by the mixing unit, wherein the filter member may be disposed at the periphery of the releasing port releasing the CO2 water from the mixing unit toward the nozzle, on the transfer line transferring the CO2 water generated by mixing deionized water and CO2 from the mixing unit to the nozzle. For example, the filter member may be disposed on a transfer line configured to transfer the CO2 water from the mixing unit to the nozzle, and the transfer line may include a first section in which the CO2 water may flow at a first flow rate and a second section in which the CO2 water may flow at a second flow rate greater than the first flow rate, and the filter member may be disposed in the first section.

According to the present disclosure, the phenomenon, in which the slower a flow rate of the fluid passing through the filter member, the greater the retention rate in the filter member, is applied to the process of supplying the CO2 water and the filter member is disposed in the low flux section in the CO2 water supply unit, so that the efficiency of the filter member is improved to improve the particle removal efficiency in the CO2 water, thereby increasing the lifespan of the filter member.

The effect of the present disclosure is not limited to the above description, and other effects not mentioned will be clearly understood by those skilled in the art from the subsequent description.

DETAILED DESCRIPTION OF THE INVENTION

Figure 1:
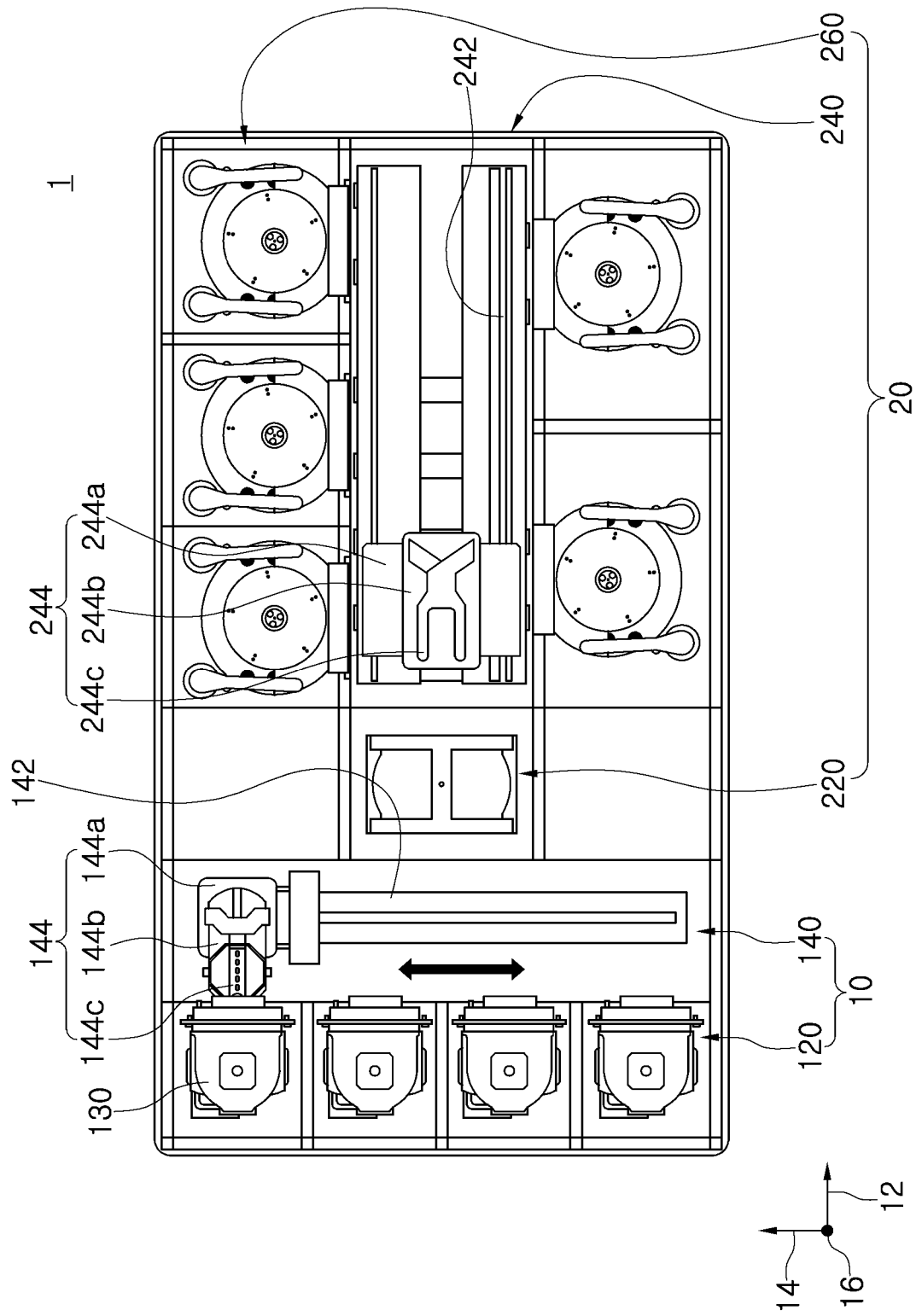
FIG. 1 is a top view showing an example of substrate processing equipment to which the present disclosure is applied.

Hereinbelow, exemplary embodiments of the present disclosure will be described in detail with reference to the accompanying drawings such that the present disclosure can be easily embodied by one of ordinary skill in the art to which the present disclosure belongs. However, the present disclosure may be changed to various embodiments and the scope and spirit of the present disclosure are not limited to the embodiments described hereinbelow. For example, variations in manufacturing method and/or tolerances are to be expected. Therefore, the embodiments of the present disclosure are not described as being limited to specific shapes of regions described with accompanying drawings, but includes deviations in shape, and elements illustrated in the drawings are purely schematic and shapes thereof are not intended to illustrate the exact shapes of the elements, nor intended to limit the scope of the present disclosure. In the description with reference to the accompanying drawings, the same or corresponding components regardless of reference numerals are given the same reference numerals, and duplicate descriptions thereof will be omitted.

In describing the embodiment of the present disclosure, when the functions and conventional elements and the detailed description of elements related with the present disclosure may make the gist of the present disclosure unclear, a detailed description of those elements will be omitted, and the same reference numerals will be used throughout the drawings and the description to refer to the same or like elements or parts.

At least some of the terms used in the specification may be defined in consideration of functions thereof in the present disclosure, which may be varied according to the intention of a user, practice, or the like, so that the terms should be defined based on the contents of this specification.

As used herein, the singular forms "a", "an", and "the", are intended to include the plural foams as well, unless the context clearly indicates otherwise. Unless the context clearly indicates otherwise, it will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof. It will be understood that when an element is referred to as being "coupled" or "connected" to another element, it can be directly coupled or connected to the other element or intervening elements may be present therebetween.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, it should be understood that the shape or size of the elements, thickness of line, etc. shown in the drawings may be exaggeratedly drawn to provide an easily understood description of the structure of the present invention.

FIG. 1 is a plane view schematically showing an example of substrate processing equipment to which the present disclosure may be applied. Referring to FIG. 1, the substrate processing equipment 1 to which the present disclosure is applied includes an index module 10 and a process treatment module 20. The index module 10 includes a loading port 120 and an index frame 140. The loading port 120, the index frame 140, and the process treatment module 20 are sequentially disposed in a row. Hereinbelow, a direction of disposition of the loading port 120, the index frame 140, and the process treatment module 20 is referred to as a first direction 12, and when seen from the top, a direction perpendicular to the first direction 12 is referred to as a second direction 14, and a direction perpendicular to a plane including the first direction 12 and the second direction 14 is referred to as a third direction 16.

A carrier 130 storing a substrate W therein may be loaded in the loading port 120. A plurality of loading ports 120 is provided and may be disposed in a row in the second direction 14. Then number of the loading ports 120 may be increased or reduced depending on the process efficiency and a footprint condition of the process treatment module 20. A plurality of slots (not shown) may be formed in the carrier 130 to store substrates W therein while the substrates W are disposed horizontally to the ground. A front opening unified pod (FOUP) may be used as the carrier 130.

The process treatment module 20 may include a buffer unit 220, a transfer chamber 240, a process unit 260, and the process unit 260. The transfer chamber 240 may be disposed such that a longitudinal direction thereof is in parallel to the first direction 12. Process units 260 may be respectively disposed at opposite portions of the transfer chamber 240. Some of the process units 260 are disposed in the longitudinal direction of the transfer chamber 240. Furthermore, some of the process units 260 are disposed to be stacked to each other. For example, at one side of the transfer chamber 240, the process units 260 may be disposed in A×B array. Here, A is the number of the process units 260 provided in a row in the first direction 12, and B is the number of the process units 260 provided in a row in the third direction 16. When 4 or 6 process units 260 are disposed on one side of the transfer chamber 240, the process units 260 may be disposed in array of 2×2 or array of 3×2. Then number of the process unit 260 may be increased or reduced. Unlike the above disclosures, the process unit 260 may be provided only at one side of the transfer chamber 240. Furthermore, the process unit 260 may be provided in a single layer at one side or opposite sides of the transfer chamber 240.

The buffer unit 220 may be disposed between the index frame 140 and the transfer chamber 240. The buffer unit 220 provides a space where the substrate W stays before the substrate W is transferred between the transfer chamber 240 and the index frame 140. A slot (not shown) may be provided in the buffer unit 220 and the substrate W is loaded on the slot. A plurality of slots (not shown) may be provided to be spaced apart from each other in the third direction 16. The buffer unit 220 may have a surface facing the index frame 140 and a surface facing the transfer chamber 240 and the surfaces may be opened.

The index frame 140 may transfer the substrate W between the carrier 130 loaded in the loading port 120 and the buffer unit 220. The index frame 140 may include an index rail 142 and an index robot 144. The index rail 142 has a longitudinal direction parallel to the second direction 14. The index robot 144 is provided on the index rail 142, and moves in a straight line in the second direction 14 along the index rail 142. The index robot 144 may include the base 144a, a body 144b, and an index arm 144c. The base 144a may be provided to be movable along the index rail 142. The body 144b is coupled to the base 144a, and the body 144b may be provided to be movable on the base 144a along the third direction 16. Furthermore, the body 144b may be provided to be rotatable on the base 144a. The index arm 144c is coupled to the body 144b, and may be provided to be movable forward and rearward with respect to the body 144b. A plurality of index arms 144c may be provided to be individually operated. The index arms 144c may be disposed to be stacked while being spaced apart from each other in the third direction 16. Some of the index arms 144c are used when the substrate W is transferred from the process treatment module 20 to the carrier 130 and others may be used to transfer the substrate W from the carrier 130 to the process treatment module 20. This is to prevent, in a process of the index robot 144 inserts and carries out the substrate W, particles generated from the substrate W before the process from being attached to the substrate W after the process.

The transfer chamber 240 may transfer the substrate W between the buffer unit 220 and the process unit 260, and between the process units 260. The transfer chamber 240 may include a guide rail 242 and a main robot 244. The guide rail 242 may be disposed such that a longitudinal direction thereof is parallel to the first direction 12. The main robot 244 is provided on the guide rail 242, and may move in a straight line on the guide rail 242 in the first direction 12. The main robot 244 may include a base 244a, a body 244b, and a main arm 244c. The base 244a may be provided to be movable along the guide rail 242. The body 244b is coupled to the base 244a, and the body 244b may be provided to be movable on the base 244a along the third direction 16. Furthermore, the body 244b may be provided to be rotatable on the base 244a. The main arm 244c is coupled to the body 244b, and may be provided to be movable forward and rearward with respect to the body 244b. A plurality of main arms 244c may be provided to be individually operated. The main arms 244c may be disposed to be stacked while being spaced apart from each other in the third direction 16.

The process unit 260 may perform a treatment process with respect to the substrate. The process unit 260 may include a substrate processing apparatus for liquid-processing the substrate W by supplying chemical liquid to the substrate W. As an embodiment to which the present disclosure is applied, the substrate processing apparatus performing a cleaning process by supplying a cleaning liquid to the substrate W will be described as an example. The process unit 260 may have a different structure for each type of cleaning process. Furthermore, the process units 260 may have the same structures. Optionally, the process units 260 are divided into a plurality of groups, and apparatuses provided in process units 260 belonging to the same group have the same structure and apparatuses provided in process units 260 belonging to different groups may have different structures.

Figure 2:
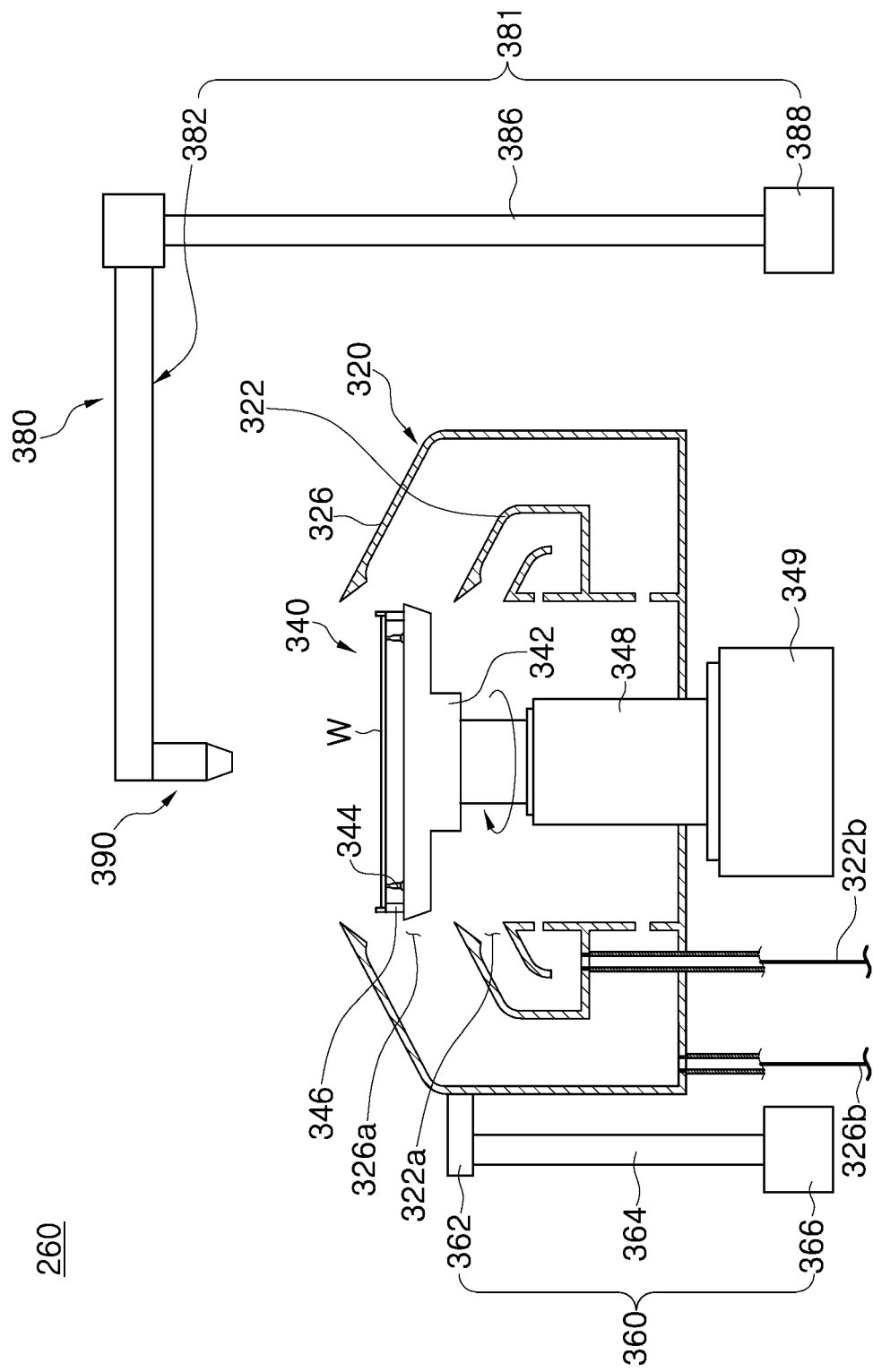
FIG. 2 is a sectional view schematically showing a process unit of FIG. 1.

FIG. 2 is a sectional view schematically showing a process unit 260 of FIG. 1. Referring to FIG. 2, the process unit 260 may include a processing container 320, a substrate support member 340, an elevation unit 360, and a liquid discharge unit 380.

The processing container 320 may provide a processing space therein for processing the substrate. The processing container 320 may have a barrel shape having an open upper portion. In the process, the processing container 320 may prevent the chemical liquid supplied to the substrate W from being scattered to the surroundings. As an example, the processing container 320 may include an inner recovery container 322 and an external recovery container 326. Each recovery container 322, 326 may recover a different chemical liquid among chemical liquids used in the process. The has a ring shape surrounding a spin head 340, and the external recovery container 326 may have a ring shape surrounding inner recovery container 322. An inner space 322a of the inner recovery container 322 and the inner recovery container 322 may serve as a first inlet 322a through which the chemical liquid flows into the inner recovery container 322. A gap space 326a between the inner recovery container 322 and the external recovery container 326 may serve as a second inlet 326a through which the chemical liquid flows into the external recovery container 326. As an example, each inlet 322a, 326a may be located at different positions. A recovery line 322b, 326b may be connected to a lower surface of the recovery container 322, 326. A chemical liquid flowing into the recovery container 322, 326 may be supplied to an external chemical liquid recycling system (not shown) via the recovery line 322b, 326b and may be reused.

The substrate support member 340 supports the substrate W in the processing space. The substrate support member 340 may be provided into a spin head that supports and rotates the substrate W in preceding the process. The substrate support member 340 may include a support body 342, a support pin 344, a chuck pin 346, and a rotation driving member 348 and 349. The support body 342 may have an upper surface and a lower surface that are generally provided in circular shapes. The lower surface has a diameter smaller than a diameter of the upper surface. The upper surface and the lower surface are located concentrically such that center shafts thereof match with each other.

A plurality of support pins 344 is provided and may be disposed to be spaced apart from each other at predetermined intervals on an edge of the upper surface of the support body 342. The support pin 344 may be provided to protrude upward from the support body 342. The support pins 344 may be disposed in a ring shape as a whole by combination thereof. The support pins 344 may support an edge of a rear surface of the substrate W so that the substrate W is spaced apart from the upper surface of the support body 342 at a predetermined distance.

A plurality of chuck pins 346 is provided and may be disposed far away from the support body 342 than the support pins 344. The chuck pins 346 may be provided to protrude upward from the support body 342. The chuck pins 346 support a lateral portion of the substrate W so as to prevent the substrate W from deviating from a regular position thereof when the support body 342 is rotated. The chuck pins 346 may be provided to be movable in a straight line between outer positions and inner positions in a radial direction of the support body 342. Here, the outer positions mean positions located far away from the center of the support body 342 than the inner positions. When the substrate W is loaded or unloaded with respect to the support body 342, the chuck pins 346 are located at the outer positions, and when the process for the substrate W is performed, the chuck pin 346 may be located at the inner positions. At this time, the inner positions are positions where the chuck pins 346 and the lateral portion of the substrate W are brought into contact with each other, and the outer positions are positions where the chuck pins 346 and the substrate W are spaced apart from each other.

The rotation driving member 348 and 349 rotates the support body 342. The rotation driving member 348 and 349 allows the support body 342 to be rotated on a center shaft thereof. The rotation driving member 348 and 349 includes a supporting shaft 348 and a driving part 349. The supporting shaft 348 has a barrel shape having a height according to the third direction 16. An upper end of the supporting shaft 348 may be securely coupled to a lower surface of the support body 342. As an example, the supporting shaft 348 may be securely coupled to the center portion of the lower surface of the support body 342. The driving part 349 provides a driving force to allow the supporting shaft 348 to be rotated. The supporting shaft 348 is rotated by the driving part 349, and the support body 342 may be rotated together with the supporting shaft 348.

The elevation unit 360 moves the processing container 320 vertically in a straight line. As the processing container 320 moves vertically, a relative height of the processing container 320 with respect to the support body 342 may be changed. The elevation unit 360 includes a bracket 362, a moving shaft 364, and an actuator 366. The bracket 362 is securely installed at an outer wall of the processing container 320, and the moving shaft 364 may be securely coupled to the bracket 362 to vertically move by the actuator 366.

As an example, when the substrate W is loaded on the support body 342 or is raised from the support body 342, the processing container 320 is lowered so that the support body 342 protrudes upward than the upper portion of the processing container 320, and during the process, the height of the processing container 320 may be adjusted so that a chemical liquid can be introduced into the preset recovery container 322, 326 according to a type of the chemical liquid supplied to the substrate W. Optionally, the elevation unit 360 may move the support body 342 vertically.

The liquid discharge unit 380 discharges a chemical liquid onto the substrate W. The liquid discharge unit 380 may include a moving member 381 and a nozzle 390.

The moving member 381 may move the nozzle 390 to a process position and a stand-by position. Here, the process position may be defined as a position where the nozzle 390 faces the substrate W loaded on the substrate support member 340 and the stand-by position may be defined as a position where the nozzle 390 is separated from the process position.

The moving member 381 may include the support shaft 386, an arm 382, and an actuator 388. The support shaft 386 may be located at one side of the processing container 320. The support shaft 386 may have a rod shape of which a longitudinal direction is directed in the third direction. The support shaft 386 may be provided to be rotatable by the actuator 388. Furthermore, the support shaft 386 may be provided to be movable upward and downward. The arm 382 is coupled to an upper end of the support shaft 386 and the arm 382 may be extended to be perpendicular from the support shaft 386. The nozzle 390 may be securely coupled to an end of the arm 382. The nozzle 390 is movable in a swinging manner together with the arm 382 as the support shaft 386 is rotated. The nozzle 390 may be moved to the process position and the stand-by position while being swingingly moved. Optionally, the arm 382 may be provided to be movable forward and rearward in the longitudinal direction. When viewed from the top, a moving path of the nozzle 390 may be the same as the center shaft of the substrate W at the process position. As an example, the chemical liquid may be one of chemicals, rinse liquids, and organic solvents. Alternately, the chemical liquid may be a mixture of two or more chemical liquids. Meanwhile, unlike that shown in FIG. 2, a plurality of liquid discharge units 380 may be provided, and may supply different types of chemical liquids.

FIGS. 3 to 6 are views showing a chemical liquid supply unit according to an embodiment of the present disclosure. As the embodiment to which the present disclosure is applied, the chemical liquid supply unit will be illustrated, and the chemical liquid supply unit is configured to have a substrate such as a wafer, etc. as a target of processing and to perform a cleaning process by supplying $CO_2$ water, as a chemical liquid, that is a mixture of $CO_2$ and deionized water (DIW) with respect to the target of processing. With the cleaning process using the $CO_2$ water as the chemical liquid, it is possible to prevent the substrate and the apparatus from being damaged due to static electricity generated during the process. According to the embodiment of the present disclosure, the chemical liquid supply unit may supply the chemical liquid to the nozzle 390.

Figure 3:
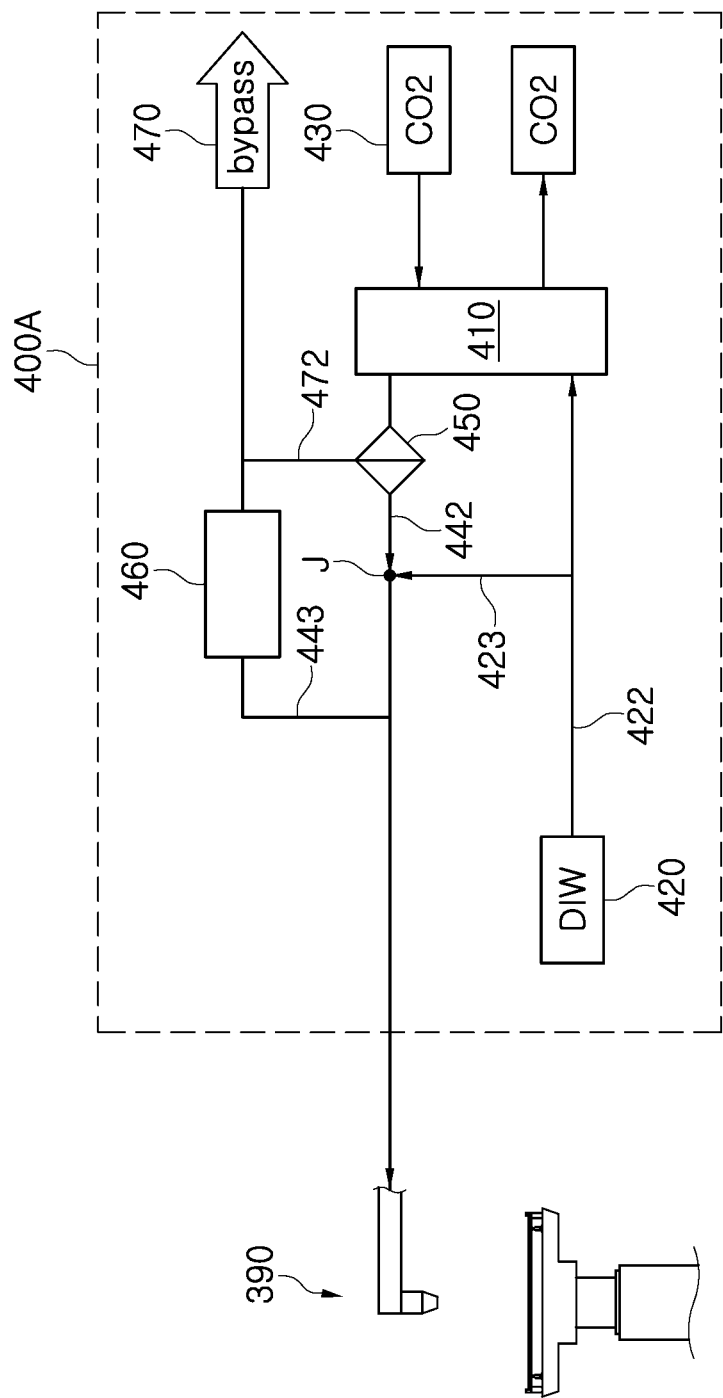
FIG. 3 is a block diagram schematically showing a chemical liquid supply unit according to a first embodiment of the present disclosure, the chemical liquid supply unit supplying chemical liquid to a nozzle of FIG. 2.
Figure 4:
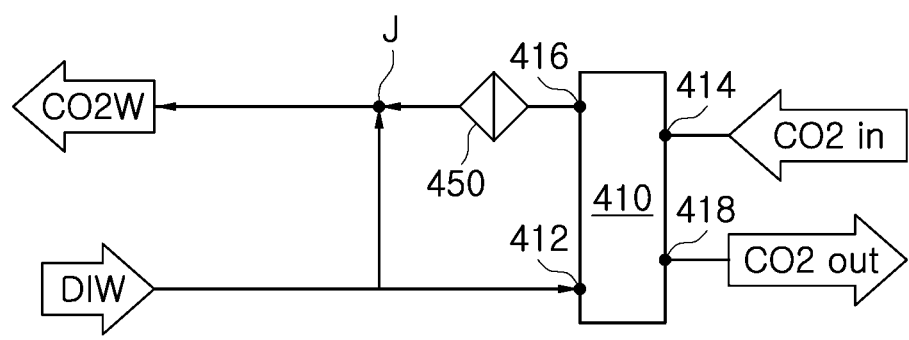
FIG. 4 is an enlarged view showing a part of FIG. 3.

FIGS. 3 and 4 are block diagrams schematically showing the chemical liquid supply unit 400A according to a first embodiment of the present disclosure, the chemical liquid supply unit 400A supplying the chemical liquid to the process unit 260 shown in FIG. 2.

Referring to FIGS. 3 and 4, according to the first embodiment of the present disclosure, the chemical liquid supply unit 400A includes a mixing unit 410, a supply unit 420, 430, and a filter member 450. The mixing unit 410 is connected to the nozzle 390 via a transfer line 442, and the filter member 450 is provided on the transfer line 442 and is configured to be located closer to the mixing unit 410 than the nozzle 390. In other words, the filter member 450 is disposed at the periphery of the mixing unit 410, on the transfer line 442.

The mixing unit 410 may be provided into a barrel shape having a storage space that is the configuration for mixing the DIW and the $CO_2$. The mixing unit 410 may include a first inlet 412 through which the DIW is injected, a second inlet 414 through which the $CO_2$ is injected, a releasing port 416 through which the $CO_2$ water that is a mixture of the DIW and the $CO_2$ is released toward the nozzle 390, and an outlet 418 through which surplus $CO_2$ is discharged. Furthermore, a mixing member may be provided in an internal space of the mixing unit 410 to mix the DIW and the $CO_2$. For example, the mixing member may be provided into a form such as a mixer, a bubbler, a contactor, and the like.

The supply unit may include a first supply unit 420 configured to supply the DIW to the mixing unit 410 and a second supply unit 430 configured to supply the $CO_2$ to the mixing unit 410.

The first supply unit 420 is connected to the mixing unit 410 via a connection line 422, and may supply the DIW into the internal space of the mixing unit 410 via the first inlet 412.

The second supply unit 430 is connected to the mixing unit 410 via a separate tube, and may supply the $CO_2$ in a gas state into the internal space of the mixing unit 410 via the second inlet 414.

The transfer line 442 connects the nozzle 390 to a mixing unit 430, and may include a first section and a second section. Specifically, the transfer line 442 may include the first section in which the $CO_2$ water flows at a first flow rate and the second section in which the $CO_2$ water flows at a second flow rate greater than the first flow rate. The detailed description of the first and second sections will be described later.

The filter member 450 is configured to remove foreign substances from the $CO_2$ water by filtering foreign substances (e.g., contaminants, particles, etc.) from the $CO_2$ water mixed by the mixing unit 430 and transferred to the nozzle 390, and may be provided at a region close to the mixing unit 410, on the transfer line 442. Specifically, the filter member 450 may be provided at the periphery of the releasing port 416, on the transfer line 442.

Meanwhile, the connection line 422 is branched at a section between the first supply unit 420 and the mixing unit 410, and a first branch line 423 branched from the connection line 422 may join the transfer line 442. Accordingly, the first supply unit 420 can supply the DIW to not only the mixing unit 410, but also the transfer line 442. The above-described configuration is to maintain a resistivity of the $CO_2$ water at a constant value, and a join point J where the first branch line 423 and the transfer line 442 according to the present disclosure join each other is located downstream than a position where the filter member 450 is disposed. As an example, the resistivity of the $CO_2$ water may be maintained at 0.2 MΩ·m.

As the DIW is supplied via the join point J, with the join point J as a starting point, a flux difference and a flow rate difference may occur between an upstream and a downstream. A section before the join point J, i.e., a section where the filter member 450 is disposed has a flux less than a flux of a section after the join point J, so that the section where the filter member 450 is disposed is a relatively low flux and low flow rate section.

Therefore, the transfer line 442 may be divided into the first section and the second section on the basis of the join point J. The section located upstream than the join point J and in which the $CO_2$ water flows at a relatively low flux (the first flow rate) may be the first section and the section located downstream than the join point J and in which the $CO_2$ water flows at a relatively high flux (the second flow rate greater than the first flow rate) by the DIW added via the join point J may be the second section. In other words, the filter member 450 according to the present disclosure may be disposed in the first section on the transfer line 442.

When the filter member 450 is disposed at the first section that is the relatively low flux section, the efficiency of the filter member 450 may increase because a retention rate of the filter member 450 is increased in comparison to when the filter member 450 is disposed in the second section that is the relatively high flux section. The above-described configuration is a result obtained by comparing properties of irregular movement (Brownian motion) of contaminant particles in a fluid and a time of a fluid containing contaminant particles passing through the filter member 450. The slower a flow rate of the fluid passing through the filter member 450, the greater the probability of collision between the contaminant particles existing in the fluid with irregular movement and the filter member 450.

In other words, as the first branch line 423 and the transfer line 442 join each other at a position downstream than the disposed position of the filter member 450, the efficiency of removing foreign substances in the $CO_2$ water can be maximized. Therefore, according to the present disclosure, the $CO_2$ water with improved cleanliness can be supplied to the nozzle 390.

Meanwhile, the chemical liquid supply unit 400A may include a measurement unit 460 and a discharge unit 470. The measurement unit 460 is configured to measure a resistivity of the $CO_2$ water that is completed with a constant resistivity and transferred finally to the nozzle 390 and the discharge unit 470 is configured to discharge reaction byproduct such as the foreign substances removed from the $CO_2$ water.

The measurement unit 460 may be provided on a second branch line 443 branched from the transfer line 442, and a branch point of the transfer line 442 is preferably located downstream than the join point J. The $CO_2$ water transferred to the measurement unit 460 via the second branch line 443 may be discharged after a measurement process. Based on a resistivity value measured by the measurement unit 460, a flux of the DIW supplied to the transfer line 442 may be adjusted or a replacement time of the filter member 450 may be determined.

The discharge unit 470 may be configured to discharge the byproduct (bypass) generated from the chemical liquid supply unit 400A to the outside space. Specifically, the discharge unit 470 may be configured to discharge the byproduct generated in the process in which the $CO_2$ water is transferred from the mixing unit 410 to the nozzle 390. The discharge unit 470 may be connected to the filter member 450 via a discharge line 472. The foreign substances removed from the $CO_2$ water by the filter member 450 may be discharged to the outside space via the discharge line 472 and the discharge unit 470. Furthermore, the discharge unit 470 may be connected to the measurement unit 460 via a tube, etc. and discharge the CO2 water completed in measurement to the outside space of the apparatus.

Figure 5:
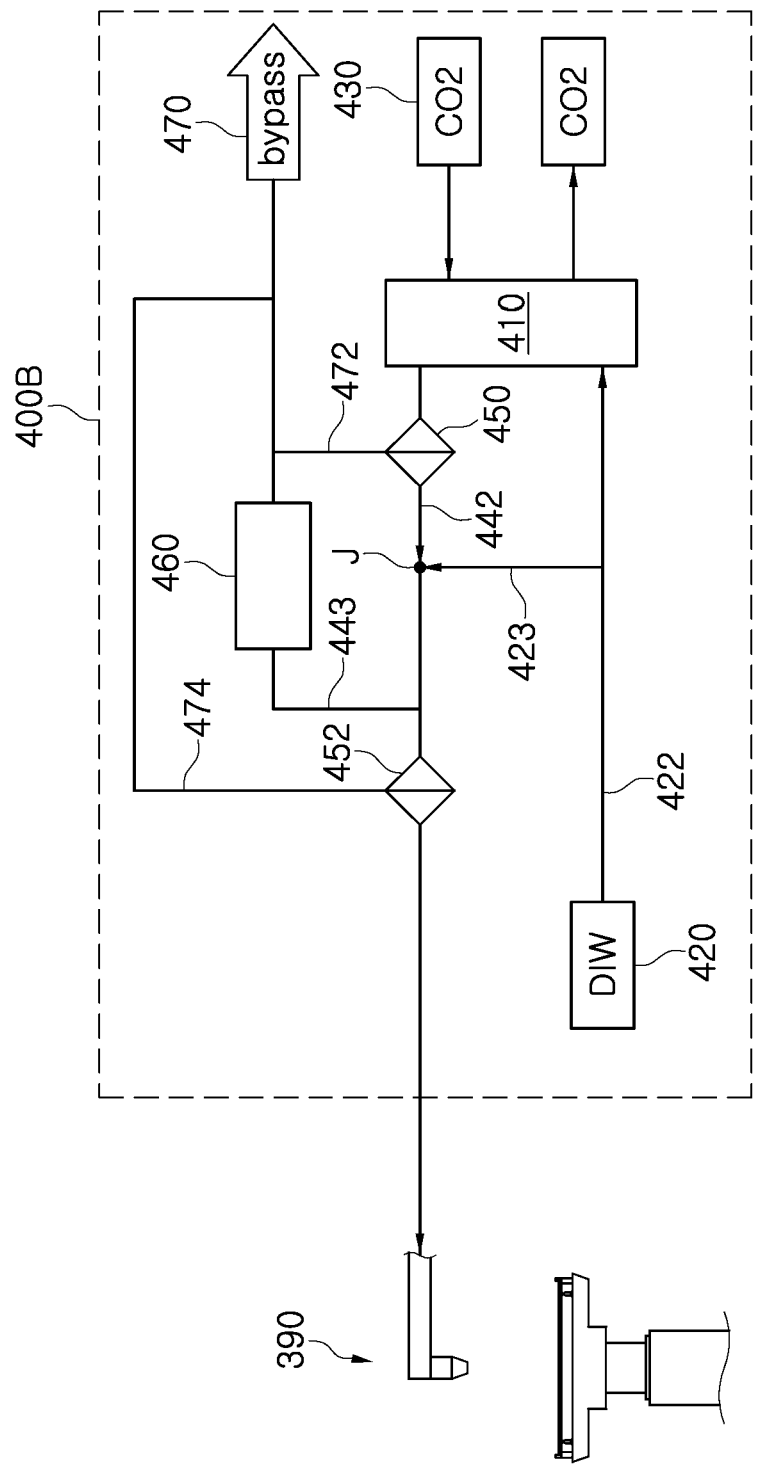
FIG. 5 is a block diagram schematically showing the chemical liquid supply unit according to a second embodiment of the present disclosure to supply chemical liquid to the nozzle of FIG. 2.
Figure 6:
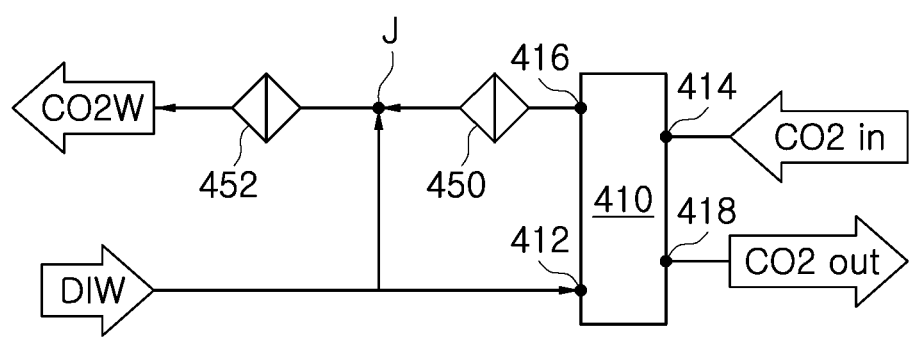
FIG. 6 is an enlarged view showing a part of FIG. 5.

FIGS. 5 and 6 are block diagrams schematically showing the chemical liquid supply unit 400A according to a second embodiment of the present disclosure, the chemical liquid supply unit 400B supplying the chemical liquid to the process unit 260 shown in FIG. 2.

Referring to FIGS. 5 and 6, according to the second embodiment of the present disclosure, the chemical liquid supply unit 400B includes a mixing unit 410, a supply unit 420, 430, the filter member 450, and a second filter member 452. The mixing unit 410 is connected to the nozzle 390 via the transfer line 442, a plurality of filter members is provided on the transfer line 442, the plurality of filter members 450 is disposed closer to the mixing unit 410 than the nozzle 390, the second filter member 452 is disposed closer to the nozzle 390 than the mixing unit 410. Furthermore, it is characterized in that the plurality of filter members 450 is disposed closer to the mixing unit 410 than the second filter member 452 and the second filter member 452 is disposed closer to the nozzle 390 than the plurality of filter members 450.

In other words, according to the second embodiment of the present disclosure, the chemical liquid supply unit 400B has the same configuration as the chemical liquid supply unit 400A according to the first embodiment, except for including the second filter member 452 and a second discharge line 474. Therefore, except for the second filter member 452 and the second discharge line 474, the descriptions of the configurations will be omitted.

The second filter member 452 is provided on the transfer line 442, and is disposed downstream than the join point J where the first branch line 423 and the transfer line 442 join each other. In other words, the second filter member 452 may be disposed any one position on the second section of the transfer line 442.

Meanwhile, FIG. 5 shows an example in which the second filter member 452 is located downstream than the branch position of the second branch line 443, but the second filter member 452 may be located upstream than the branch position of the second branch line 443, on the second section of the transfer line 442.

The second filter member 452 is configured to remove foreign substances from the CO2 water by filtering foreign substances (e.g., contaminants, particles, etc.) from the CO2 water mixed by the mixing unit 430 and transferred to the nozzle 390, and may be provided at the periphery of the nozzle 390, on the transfer line 442. The second filter member 452 may have the same configuration as the filter member 450.

The discharge unit 470 and the second filter member 452 may be connected to each other via the second discharge line 474. The foreign substances removed from the CO2 water by the second filter member 452 may be discharged to the outside space via the second discharge line 474 and the discharge unit 470.

According to the second embodiment of the present disclosure, as the number of filters increases, the efficiency of removing foreign substances in the CO2 water can be improved.

Figure 7:
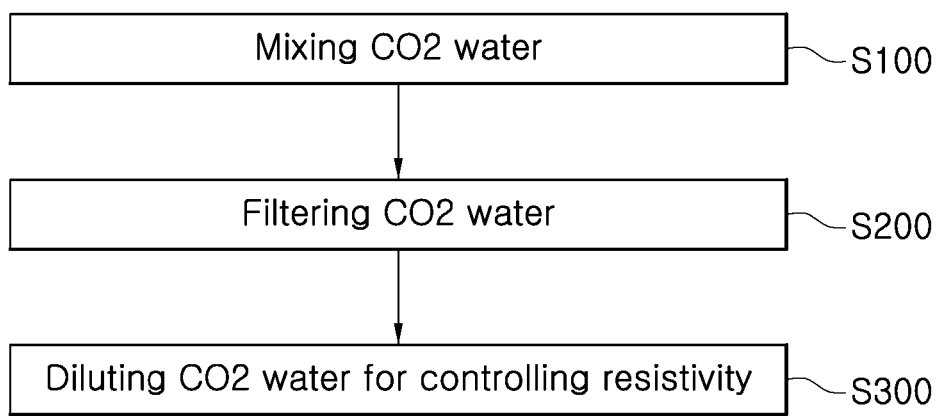
FIG. 7 is a flowchart showing an embodiment of a chemical liquid supply method according to the present disclosure.

FIG. 7 is a flowchart showing an embodiment of a chemical liquid supply method according to the present disclosure. As the embodiment to which the present disclosure is applied, a chemical liquid supply method will be illustrated, and the chemical liquid supply method is configured to have a substrate such as a wafer, etc. as a target of processing and to perform a cleaning process by supplying CO2 water, as a chemical liquid, that is a mixture of CO2 and deionized water (DIW) with respect to the target of processing.

The chemical liquid supply method according to the present disclosure may be performed by the chemical liquid supply unit 400 and the substrate processing apparatus including the same, which are described above.

The chemical liquid supply method according to the present disclosure may include mixing CO2 water at 5100, filtering the CO2 water at 5200, and diluting the CO2 water at 5300 to control the resistivity of the CO2 water.

The mixing of the CO2 water at 5100 is performed by mixing the DIW and the CO2 to generate the CO2 water and may be performed by the mixing unit 410 into which the DIW and the CO2 are respectively injected.

The filtering of the CO2 water at 5200 may be performed by removing foreign substances existing in the CO2 water while the completed the CO2 water passing through the filter member 450, and may be performed by the filter member 450 filtering the CO2 water.

The diluting of the CO2 water at 5300 is performed to control the resistivity to the CO2 water constant and may be performed by the process in which the DIW is added into the generated CO2 water. At this point, as the diluting of the CO2 water at 5300 is performed later than the filtering of the CO2 water at 5200, the efficiency of the filter member 450 can be improved and the efficiency of removing particles in the CO2 water can be improved. As the CO2 water of a relatively low flux passes through the filter member 450, the retention rate in the filter member 450 increases. As the efficiency of the filter member 450 is improved, the lifespan of the filter member 450 can be improved.

Meanwhile, as a filtering of the CO2 water by the second filter member 452 is added after the diluting of the CO2 water at 5300, the efficiency of removing foreign substances in the CO2 water can be further improved.

Meanwhile, although not shown in the drawings in detail, the chemical liquid supply unit 400 according to the embodiment of the present disclosure may include a storage unit (not shown). The storage unit (not shown) may be provided between the nozzle 390 and the mixing unit 410. The storage unit (not shown) may be provided between the nozzle 390 and the mixing unit 410, on the transfer line 442, and may receive the CO2 water mixed in the mixing unit 430 via the transfer line 442 and store the CO2 water therein. As an example, the storage unit (not shown) may be disposed downstream than the join point J where the first branch line 423 and the transfer line 442 join each other. As an example, the storage unit (not shown) may be disposed downstream than the second filter member 452. The storage unit (not shown) may be provided as a container shape having a space in which the CO2 water is stored, and the CO2 water stored in the storage unit (not shown) may be transferred to the process unit 260, i.e., to the nozzle 390.

Although the preferred embodiments of the present disclosure have been disclosed for illustrative purposes, those skilled in the art will appreciate that various modifications, additions and substitutions are possible, without departing from the scope and spirit of the invention as disclosed in the accompanying claims. Therefore, the embodiments of the present disclosure are intended to described, without limiting the technical ideas of the present disclosure, and the technical ideas of the present disclosure are not limited by the embodiments. The scope of the present disclosure will be interpreted by the accompanying claims, and those skilled in the art should understand that all technical ideas within equivalent scope should be included in the scope of the present disclosure.

What is claimed is:

1. A chemical liquid supply unit comprising:
a mixing unit configured to mix deionized water and a $CO_2$ gas to generate a $CO_2$ water;
a first supply unit configured to supply the deionized water to the mixing unit;
a second supply unit configured to supply the $CO_2$ gas to the mixing unit;
a filter member configured to remove foreign substances in the $CO_2$ water mixed by the mixing unit; and
a transfer line configured to transfer the $CO_2$ water from the mixing unit onto a substrate,
wherein the transfer line comprises:
a first section in which the $CO_2$ water flows at a first flow rate; and
a second section in which the $CO_2$ water flows at a second flow rate greater than the first flow rate, and
wherein the filter member is disposed in the first section.

2. The chemical liquid supply unit of claim 1,
wherein the first supply unit is connected to the mixing unit via a connection line, and a first branch line branched from the connection line joins the transfer line.

3. The chemical liquid supply unit of claim 2,
wherein a join point of the first branch line and the transfer line is located downstream than a point where the filter member is disposed, and the first supply unit is configured to supply the deionized water to the transfer line via the first branch line.

4. The chemical liquid supply unit of claim 3, further comprising:
a second filter member disposed on any one point on the second section of the transfer line.

5. The chemical liquid supply unit of claim 1, further comprising:
a measurement unit configured to measure a resistivity of the $CO_2$ water.

6. The chemical liquid supply unit of claim 1, further comprising:
a discharge unit configured to discharge byproduct generated in a process in which the $CO_2$ water is transferred along the transfer line.

7. The chemical liquid supply unit of claim 1,
wherein the mixing unit comprises:
a first inlet through which the deionized water is injected;
a second inlet through which the $CO_2$ gas is injected;
a releasing port configured to release the $CO_2$ water generated by mixing the deionized water and $CO_2$ toward the transfer line; and
an outlet configured to discharge surplus $CO_2$.

8. A substrate processing apparatus comprising:
a substrate support member configured to support a substrate;
a nozzle configured to spray $CO_2$ water generated by mixing a $CO_2$ gas with deionized water to the substrate loaded on the substrate support member; and
a chemical liquid supply unit configured to supply the $CO_2$ water to the nozzle,
wherein the chemical liquid supply unit comprises:
a mixing unit configured to mix deionized water and $CO_2$;
a first supply unit configured to supply the deionized water to the mixing unit;
a second supply unit configured to supply the $CO_2$ to the mixing unit; and
a filter member configured to remove foreign substances in the $CO_2$ water mixed by the mixing unit,
wherein the filter member is disposed on a transfer line configured to transfer the $CO_2$ water from the mixing unit to the nozzle,
wherein the transfer line comprises:
a first section in which the $CO_2$ water flows at a first flow rate; and
a second section in which the $CO_2$ water flows at a second flow rate greater than the first flow rate, and
wherein the filter member is disposed in the first section.

9. The substrate processing apparatus of claim 8,
wherein the first supply unit is connected to the mixing unit via a connection line, and a first branch line branched from the connection line joins the transfer line.

10. The substrate processing apparatus of claim 9,
wherein a join point of the first branch line and the transfer line is located downstream than a point where the filter member is disposed, and
the first supply unit is configured to supply the deionized water to the transfer line via the first branch line.

11. The substrate processing apparatus of claim 10,
wherein the chemical liquid supply unit further comprising:
a second filter member disposed on any one point on the second section of the transfer line.

12. The substrate processing apparatus of claim 8,
wherein the chemical liquid supply unit further comprises:
a measurement unit configured to measure a resistivity of the $CO_2$ water supplied to the nozzle.

13. The substrate processing apparatus of claim 8,
wherein the chemical liquid supply unit further comprises:
a discharge unit configured to discharge byproduct generated in a process in which the $CO_2$ water is transmitted to the nozzle.

14. The substrate processing apparatus of claim 8,
wherein the mixing unit comprises:
a first inlet through which the deionized water is injected;
a second inlet through which the $CO_2$ is injected;
a releasing port configured to release the $CO_2$ water in which the deionized water and $CO_2$ are mixed toward the nozzle; and
an outlet configured to discharge surplus $CO_2$.

15. Substrate processing equipment comprising:
a loading port in which a carrier accommodating a substrate is loaded;
an index frame in which an index robot is provided to transfer the substrate from the carrier loaded in the loading port; and
a process treatment module comprising a substrate processing apparatus configured to perform a liquid treatment process with respect to the substrate,
wherein the substrate processing apparatus comprises:
a substrate support member configured to support the substrate;
a nozzle configured to spray a chemical liquid to the substrate placed in the substrate support member; and
a chemical liquid supply unit configured to supply the chemical liquid to the nozzle, wherein the chemical liquid supply unit comprises:
  a mixing unit configured to mix deionized water and a $CO_2$ gas to a $CO_2$ water;
  a first supply unit configured to supply the deionized water to the mixing unit;
  a second supply unit configured to supply the $CO_2$ gas to the mixing unit; and
  a filter member configured to remove foreign substances in the $CO_2$ water mixed by the mixing unit,
wherein the filter member is disposed on a transfer line configured to transfer the $CO_2$ water from the mixing unit to the nozzle,
wherein the transfer line comprises:
a first section in which the $CO_2$ water flows at a first flow rate; and
a second section in which the $CO_2$ water flows at a second flow rate greater than the first flow rate, and
wherein the filter member is disposed in the first section.

16. The substrate processing equipment of claim 15,
wherein the first supply unit is connected to the mixing unit via a connection line, and
a first branch line branched from the connection line joins the transfer line.

17. The substrate processing equipment of claim 16,
wherein a join point of the first branch line and the transfer line is located downstream than a point where the filter member is disposed, and
the first supply unit is configured to supply the deionized water to the transfer line via the first branch line.

18. The substrate processing equipment of claim 17,
wherein the chemical liquid supply unit further comprises:
  a second filter member provided on one point in the second section of the transfer line.

19. The substrate processing equipment of claim 15,
wherein the chemical liquid supply unit further comprises:
  a measurement unit configured to measure a resistivity of the $CO_2$ water transferred to the nozzle.

20. The substrate processing equipment of claim 15,
wherein the chemical liquid supply unit further comprises:
  a discharge unit configured to discharge byproduct generated in a process in which the $CO_2$ water is transmitted to the nozzle.

* * * * *